United States Patent [19]

Visioli, Jr. et al.

[11] 3,748,591

[45] July 24, 1973

[54] ILLUMINATION ACTIVATED TRANSISTOR RELAXATION OSCILLATOR

[75] Inventors: Armando Joseph Visioli, Jr., Dover; Harold Allen Wittlinger, Pennington, both of N.J.

[73] Assignee: RCA Corporation, New York, N.Y.

[22] Filed: Mar. 29, 1972

[21] Appl. No.: 239,079

[52] U.S. Cl. .................... 331/66, 250/206, 331/111

[51] Int. Cl. .......................................... H03k 3/28

[58] Field of Search ............................ 331/66, 111; 250/206

[56] References Cited

UNITED STATES PATENTS

| | | | |
|---|---|---|---|
| 3,061,724 | 10/1962 | Reich | 331/66 X |
| 3,292,039 | 12/1966 | Horino | 331/66 X |
| 3,336,510 | 8/1967 | Itoh | 250/206 X |

*Primary Examiner*—Roy Lake

*Assistant Examiner*—Siegfried H. Grimm

*Attorney*—Edward J. Norton et al.

[57] ABSTRACT

An illumination activated circuit for supplying power from an oscillatory source to a load. A light sensitive device is arranged in the output circuit of the source such that the signal provided by the source to the load is initiated only when illumination above a certain intensity is received by the device, the device being in effect a dynamic load for the source.

5 Claims, 1 Drawing Figure

PATENTED JUL 24 1973
3,748,591
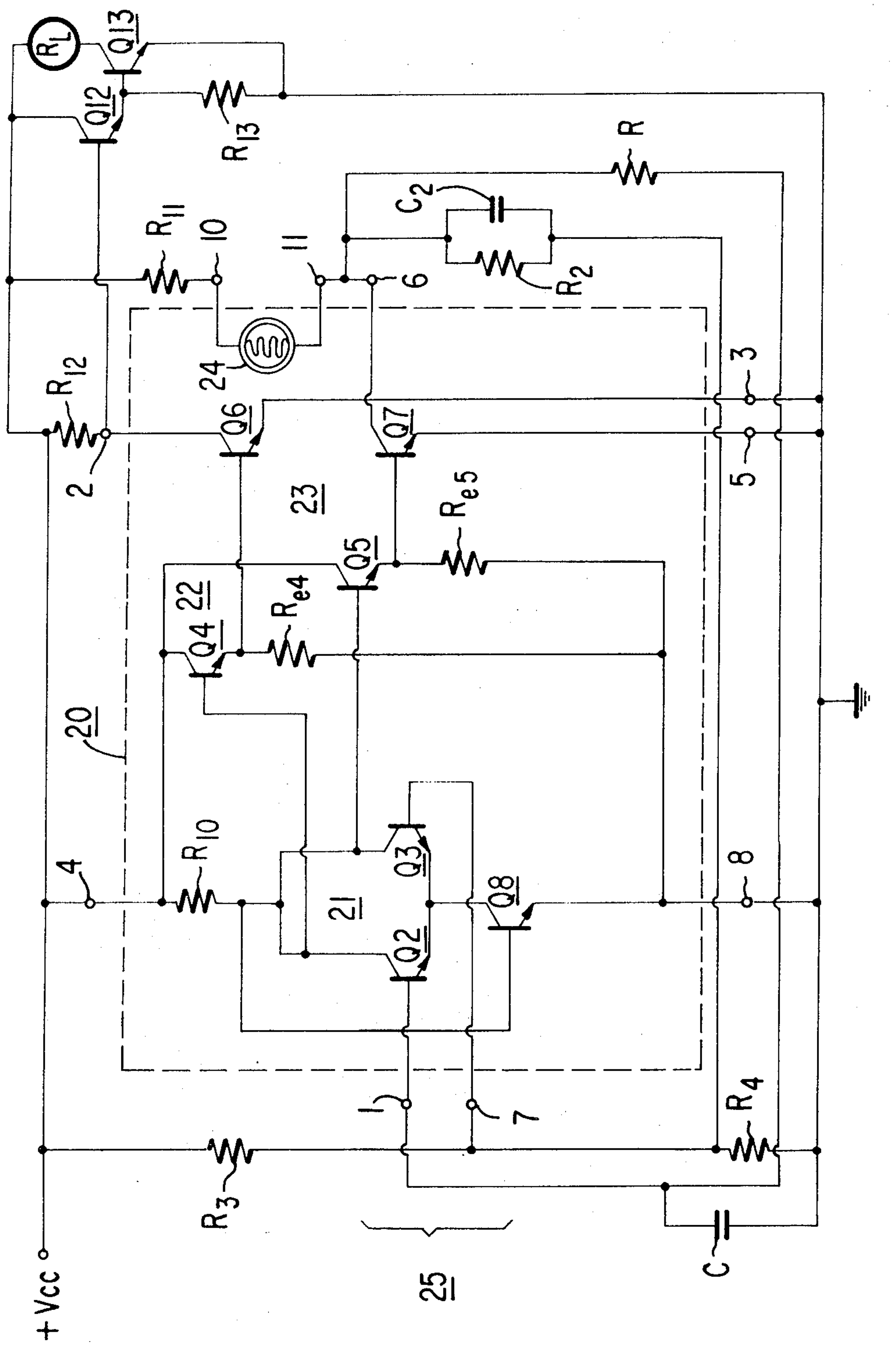

ILLUMINATION ACTIVATED TRANSISTOR RELAXATION OSCILLATOR

The present invention relates generally to control circuits and more specifically to control circuits which are light activated.

Light activated control circuits are used in a wide variety of applications, for example edge-monitoring systems, vending machine systems and photoelectric keyboards. In addition, light activated circuits may be useful in automobile oriented applications such as an automatic high beam cut off controller.

In most of the above-identified applications the illumination responsive device is generally located at the front end of the system, that is, the occurrence of the illumination causes the initiation of a signal which is then amplified or otherwise processed.

The present invention utilizes a different philosophy of operation in that the light sensitive device is used more in the nature of a dynamic load rather than an input device.

In accordance with the present invention there is provided an illumination activated circuit for supplying power to a load. The circuit includes an oscillator means which generates two signals with a 180° phase difference therebetween at two terminals respectively. A light sensitive device having a relatively low electrical resistance in the presence of illumination and a high resistance in the absenced of illumination is connected between one of the oscillator terminals and a source of potential. The other terminal of the oscillator means is connected to the load. The oscillator provides a signal and hence power to the load when the device exhibits a low electrical resistance, that is, in the presence of illumination above a certain intensity.

The sole FIGURE of the drawing shows a schematic diagram of one embodiment of the present invention.

Referring now to the sole FIGURE, a circuit shown as 20 is provided comprising generally a differential amplifier 21, two emitter follower stages 22 and 23, two drive transistors Q6 and Q7 and a light sensitive device 24. All of the elements just mentioned are shown within the dotted lines of circuit 20 since they are available in an integrated circuit package designated CA3062. Thus, physically, circuit 20 represents an integrated circuit. Circuit 20 has access terminals 1–8 and 10 and 11 shown in the FIGURE.

Terminal 1 is connected to the base electrode of transistor Q2, while terminal 7 is connected to the base electrode of transistor Q3. Transistors Q2 and Q3 form the differential amplifier 21 with the collector electrodes thereof connected to each other and the emitter electrodes thereof connected to each other.

Transistor Q8 has its collector electrode connected to the emitter electrodes of transistors Q2 and Q3. The base electrode of transistor Q8 is electrically connected back to the collector electrodes of transistors Q2 and Q3, and the emitter electrode of transistor Q8 has a connection to terminal 8 of circuit 20 which is in turn connected to a point of reference potential, namely ground. Transistor Q8 provides a constant current sink for the emitter currents of transistors Q2 and Q3 as is known in the art. The collector electrodes of transistors Q2 and Q3 are connected to terminal 4 of circuit 20 via resistor R10. Terminal 4 is in turn connected to a source of positive DC potential, Vcc.

The base electrode of transistor Q4, which is included in emitter follower circuit 22, is connected to the collector electrode of transistor Q2. The emitter electrode of transistor Q4 is connected to terminal 8 via resistor Re4, while the collector electrode of transistor Q4 has a connection to terminal 4.

Similarly, the base electrode of transistor Q5, in the emitter follower circuit 23, is connected to the collector electrode of transistor Q3, and the collector electrode of transistor Q5 has a connection to terminal 4. The emitter electrode of transistor Q5 is connected to terminal 8 via resistor Re5.

The base electrode of drive transistor Q6 is connected to the emitter electrode of transistor Q4 and the collector electrode of transistor Q6 is connected to terminal 2 of circuit 20. The emitter electrode of transistor Q6 is connected to terminal 3 which is in turn connected to ground potential.

The base electrode of transistor Q7 is connected to the emitter electrode of transistor Q5, while the collector electrode of transistor Q7 is connected to terminal 6 of circuit 20. The emitter electrode of transistor Q7 is connected to terminal 5 of circuit 20 which is in turn connected to ground potential.

The light sensitive device 24 has one end connected to terminal 10 and the other end connected to terminal 11 of circuit 20. Although device 24 may have a variety of physical forms, the actual device in the CA3062 integrated circuit comprises four photosensitive silicon transistors arranged in two parallel connected Darlington configurations. Terminal 10 is the junction of the collectors of the four photosensitive transistors and terminal 11 represents the junction of the emitter electrodes from the second transistor in each of the Darlington pairs. The important item to note at this point is that device 24 is a light sensitive element having an electrical resistance between terminals 10 and 11 which varies with light intensity. With no light in the presence of device 24 the electrical resistance is very high, on the order of several megohms. As the device 24 is illuminated with higher intensities of light the resistance between terminals 10 and 11 goes down to lower values until the device 24 saturates and exhibits a fairly constant low resistance of something on the order of 1,000 ohms or less.

Terminal 11 is electrically connected to terminal 6 and terminal 10 is electrically connected to terminal 4 via resistor R11. Terminal 6 is also connected back to terminal 1 in a feedback path via resistor R. Terminal 6 also has a connection back to terminal 7 via a parallel RC network comprising resistor R2 and capacitor C2.

In addition there is provided a voltage divider network comprising the serial combination of resistors R3 and R4 electrically connected between terminal 4 and the ground point. The junction between resistors R3 and R4 has a connection to terminal 7. Also a capacitor C is connected between terminal 1 and the point of ground potential. Terminal 2 is connected to terminal 4 via resistor R12.

The configuration thus far described forms a circuit 25 which is essentially a light activated relaxation oscillator whose operation will be discussed herein. For certain load currents, say up to 150 ma, the load to be supplied may be connected to terminal 2, that is the collector electrode of transistor Q6. However, for higher load current requirements some additional circuitry is provided. This circuitry includes transistors Q12 and Q13.

The base electrode of transistor Q12 is connected to terminal 2, and the collector electrode of transistor Q12 is electrically connected to terminal 4. The emitter electrode of transistor Q12 is connected to the base electrode of transistor Q13 and to one end of resistor R13. The other end of resistor R13 and the emitter electrode of transistor Q13 are connected to ground potential. The collector electrode of transistor Q13 is connected to one end of the load to be supplied, designated $R_L$, and the other end of the load $R_L$ is connected to terminal 4. Transistors Q12 and Q13 add an inversion to the circuit and therefore transistors Q12 and Q13 will be off when transistor Q6 is conducting and on when transistor Q6 is in a non-conducting state.

The circuit 25 forms a relaxation oscillator wherein during operation transistors Q6 and Q7 will have opposite states of conductivity. Thus, signals will be provided at terminals 2 and 6 which will be similar but 180° out of phase with respect to each other.

Resistor R2 provides a positive feedback function, while resistors R3 and R4 and the input resistance of the integrated circuit 20 control the duty cycle of the signals appearing at terminals 2 and 6. Resistor R and capacitor C provide the bulk of the timing circuit. The general expression for the frequency of oscillation is given by equation 1:

$$f \approx \frac{1}{2RC \ln\left(\frac{2Rx}{R2}+1\right)} \qquad (1)$$

where *Rx* equals the parallel combination of resistors R3, R4 and the input resistance, $R_{in}$, of the circuit 20.

The operation of the circuit 25 is as follows. With no light illuminating the device 24 and the source of potential Vcc turned on, terminal 7 rises to a level determined by the voltage divider R3 and R4. Terminal 6 starts to rise by virtue of the path from terminal 7 to terminal 6 via resistor R2. As terminal 6 rises, terminal 1 starts to rise by virtue of the connection between terminals 6 and 1 via resistor R and the start of charge build up on capacitor C. However, since the device 24 exhibits a very high resistance at this time, the potential at terminal 6 cannot rise through the divider action of resistor R11, the device 24, resistor R and the input resistor $R_{in}$ in combination with the source Vcc. Thus, terminal 1 rises somewhat in potential but not enough to toggle the differential amplifier 21. In this state, by virtue of the arrangement shown in the FIGURE, transistors Q6 and Q7 are biased on but transistors Q12 and Q13 are off and hence no signal is provided at the load $R_L$.

Now with the source Vcc being applied and with the device 24 being illuminated such that it exhibits a low electrical resistance, terminal 6 rises very high when viewed as a point on the voltage divider comprising resistor R11, the device 24, resistor R and the input resistance of the circuit 25. Here the feedback path through resistor R2 causes terminal 7 to go high in potential. Terminal 1 tries to charge up to the potential at pin 7 by charging up capacitor C to the level at terminal 6. When the potential at terminal 1 substantially reaches the potential at terminal 7, the differential amplifier 21 toggles and the result is ultimately that transistor Q6 goes off and transistor Q7 goes on. The load $R_L$ now sees a rise in potential.

With transistor Q7 turned on, terminal 6 and hence terminal 7 starts to go down. Terminal 1 starts to follow the drop in potential at terminal 7. When terminal 1 reaches substantially the same lower potential at terminal 7, the differential amplifier 21 again toggles and transistor Q7 is turned off while transistor Q6 is turned on. The load $R_L$ now sees a drop in potential.

The process described continues cycle after cycle, as long as the device 24 is in its low resistance state. The load $R_L$ is provided with an oscillating signal, that is a pulse waveform which is the inversion of the signal available at terminal 2. The load $R_L$ will be provided with a signal until the illumination intensity is removed or decreased below the level required for the toggling of differential amplifier 21.

Typical values for the elements shown in the FIGURE, where the circuit 20 is the integrated circuit CA3062, having an input resistance of 1.4K ohms, are as follows:

| | |
|---|---|
| R | 30K ohms |
| R2 | 30K ohms |
| R3 | 91K ohms |
| R4 | 160K ohms |
| R11 | 1K ohm |
| R12 | 300 ohms |
| R13 | 100 ohms |
| C 10 microfarads | |
| C2 | .0039 microfarads |

With the values shown above load currents of over 150 ma are supplied to the load $R_L$ with a 30 percent duty cycle at a frequency of approximately 18 Hertz when the device 24 is illuminated by a light intensity of approximately 70 lumens.

What is claimed is:

1. An illumination activated circuit for providing power to a load comprising:
   - an amplifier having a pair of input terminals and a pair of output terminals;
   - a first and second emitter follower circuit each having an input terminal and an output terminal, the input terminal of the first emitter follower circuit being connected to one output terminal of the amplifier, the input terminal of the second emitter follower circuit being connected to the other output terminal of the amplifier;
   - a first and second transistor each having a control electrode and two main electrodes, the control electrode of the first transistor being connected to the output terminal of the first emitter follower circuit, the control electrode of the second transistor being connected to the output terminal of the second emitter follower circuit, one main electrode of each of said transistors being connected to a point of reference potential;
   - a resistive means for connecting the other main electrode of the second transistor to one of the input terminals of said amplifier;
   - capacitive means connected between said one input terminal of said amplifier and said point of reference potential;
   - a parallel RC network connecting the other main electrode of the second transistor to the other amplifier input terminal;
   - a source of potential;
   - a first and second resistor serially connected between said source of potential and said point of reference potential;
   - means for connecting the other input terminal of the amplifier to a point between said first and second resistors;

a light sensitive device having an electrical resistance characteristic which varies with illumination thereon, said device exhibiting a relatively high electrical resistance in the absence of illumination thereon and a relatively low electrical resistance in the presence of illumination thereon, said device being connected between the other main electrode of the second transistor and said source of potential;

means for connecting the other main electrode of the first transistor to said source of potential; and means adapted for connecting said load to the other main electrode of said first transistor;

said load being provided with power only in the presence of illumination of a certain intensity on said device.

2. The circuit according to claim 1 wherein said means adapted for connecting said load to said other main electrode of said first transistor comprises:

a third and fourth transistor each having a control electrode and two main electrodes, the control electrode of the third transistor being connected to the other main electrode of the first transistor, one main electrode of the third transistor being connected to the source of potential, the other main electrode of the third transistor being connected to the control electrode of the fourth transistor, one main electrode of the fourth transistor being connected to said point of reference potential and said load being connected in circuit with the other main electrode of said fourth transistor.

3. An illumination activated circuit for providing power to a load, said circuit comprising:

an oscillator means having first and second input terminals and first and second output terminals, said oscillator means providing a first signal at the first output terminal thereof and a second signal at the second output terminal thereof, said first signal being 180 degrees out of phase with respect to said second signal;

means for connecting said load in circuit with the first output terminal of said oscillator means;

a light sensitive device connected in circuit with the second output terminal of said oscillator means, said device having an electrical resistance characteristic which varies with illumination thereon, said device exhibiting a relatively high electrical resistance in the absence of illumination thereon and a relatively low electrical resistance in the presence of illumination thereon;

a first feedback path coupling the second output terminal of the oscillator means to the first input terminal of the oscillator means;

a second feedback path coupling the second output terminal of the oscillator means to the second input terminal of the oscillator means;

means for applying a source of biasing potential to said oscillator means;

said oscillator means providing oscillations and power to said load only in the presence of illumination above a certain intensity on said device.

4. The circuit according to claim 3 wherein said oscillator means comprises:

a differential amplifier having a pair of input terminals corresponding to said oscillator means first and second input terminals and a pair of output terminals;

first and second emitter follower circuits each having an input terminal and an output terminal, the first emitter follower input terminal being connected to one differential amplifier output terminal, the second emitter follower circuit input terminal being connected to the other differential amplifier output terminal;

first and second drive transistors each having two main electrodes and a control electrode, the control electrodes of said first and second drive transistors being respectively connected to said first and second emitter follower output terminals, one main electrode of each of said drive transistors being adapted for connection to a point of reference potential, the other main electrode of said first and second drive transistors corresponding respectively to said first and second oscillator means output terminals.

5. The circuit according to claim 3 wherein said first feedback path comprises a resistance path and wherein said second feedback path comprises a parallel resistor and capacitor combination.

* * * * *